United States Patent
Piazza et al.

(10) Patent No.: US 9,373,935 B2
(45) Date of Patent: Jun. 21, 2016

(54) OPTICAL LASING DEVICE AND METHOD FOR GENERATING A LASING MODE IN SUCH DEVICE

(71) Applicant: Huawei Technologies Co., Ltd., Shenzhen (CN)

(72) Inventors: Marco Piazza, Munich (DE); Alberto Rampulla, Munich (DE); Michele Re, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/613,853

(22) Filed: Feb. 4, 2015

(65) Prior Publication Data

US 2015/0222090 A1    Aug. 6, 2015

(30) Foreign Application Priority Data

Feb. 5, 2014  (EP) .................................... 14153977

(51) Int. Cl.
| | |
|---|---|
| *H01S 5/14* | (2006.01) |
| *H01S 3/105* | (2006.01) |
| *H01S 3/106* | (2006.01) |
| *H01S 5/06* | (2006.01) |

(Continued)

(52) U.S. Cl.
CPC ................. *H01S 5/141* (2013.01); *H01S 3/105* (2013.01); *H01S 3/1062* (2013.01); *H01S 5/0617* (2013.01); *H01S 3/08027* (2013.01); *H01S 5/0622* (2013.01); *H01S 5/0687* (2013.01)

(58) Field of Classification Search
CPC ..... H01S 5/141; H01S 5/0617; H01S 5/0622; H01S 5/0687; H01S 3/105; H01S 3/1062
USPC ................................ 372/9, 12, 20, 25, 28, 31
See application file for complete search history.

(56) References Cited

U.S. PATENT DOCUMENTS

| | | | |
|---|---|---|---|
| 674,332 A | 5/1901 | Brewer | |
| 5,161,165 A | 11/1992 | Zorabedian | |

(Continued)

FOREIGN PATENT DOCUMENTS

| | | |
|---|---|---|
| EP | 1349245 A2 | 10/2003 |
| EP | 1850431 A1 | 10/2007 |

(Continued)

OTHER PUBLICATIONS

Wang, Q., et al., "Type of tunable guided-mode resonance filter based on electro-optic characteristic of polymer-dispersed liquid crystal," Optics Letters, vol. 36, No. 8, Apr. 15, 2010, pp. 1236-1238.

(Continued)

*Primary Examiner* — Dung Nguyen
(74) *Attorney, Agent, or Firm* — Conley Rose, P.C.; Grant Rodolph; Nicholas K. Beaulieu

(57) ABSTRACT

An optical lasing device includes a gain medium arranged in a lasing cavity having an optical axis, the gain medium providing light amplification; a periodic grid generator filter arranged in the lasing cavity; a channel selector arranged in the lasing cavity and configured to select a lasing mode of the amplified light corresponding to a frequency channel defined by the periodic grid generator filter according to an optimization criterion; and a band-pass filter arranged in the lasing cavity and configured to suppress lasing modes which are outside of a pass-band of the band-pass filter.

15 Claims, 14 Drawing Sheets

(51) Int. Cl.
  *H01S 3/08* (2006.01)
  *H01S 5/062* (2006.01)
  *H01S 5/0687* (2006.01)

(56) References Cited

U.S. PATENT DOCUMENTS

| | | | |
|---|---|---|---|
| 5,949,804 | A | 9/1999 | Okazaki |
| 6,526,071 | B1 | 2/2003 | Zorabedian et al. |
| 6,704,332 | B2 | 3/2004 | Chapman et al. |
| 7,209,498 | B1 * | 4/2007 | Chapman et al. ............... 372/20 |
| 2003/0231666 | A1 | 12/2003 | Daiber et al. |
| 2004/0202223 | A1 | 10/2004 | Crosson et al. |
| 2006/0072634 | A1 | 4/2006 | Daiber |
| 2007/0091964 | A1 | 4/2007 | Lutgen |
| 2007/0177637 | A1 | 8/2007 | Koyama et al. |
| 2007/0268568 | A1 | 11/2007 | Higashi et al. |
| 2013/0003185 | A1 * | 1/2013 | Fattal et al. ................... 359/629 |
| 2013/0064259 | A1 | 3/2013 | Wakabayashi et al. |

FOREIGN PATENT DOCUMENTS

| | | |
|---|---|---|
| EP | 1939653 A2 | 7/2008 |
| JP | 2006019514 A | 1/2006 |
| JP | 20060210581 A | 8/2006 |
| JP | 2007299773 A | 11/2007 |
| JP | 2009094117 A | 4/2009 |
| WO | 9301510 A1 | 1/1993 |
| WO | 2004070893 A2 | 8/2004 |
| WO | 2006002663 A1 | 1/2006 |
| WO | 2008077415 A1 | 7/2008 |
| WO | 2011148895 A1 | 12/2011 |

OTHER PUBLICATIONS

Magnusson, R., et al., "Photonic device enabled by waveguide-mode resonance effects in periodically modulated films," XP-002611860, Proceedings of SPIE, vol. 5225, No. 1, Nano- and Micro-Optics for Information Systems, Aug. 3, 2003, pp. 20-34.
Foreign Communication From a Counterpart Application, European Application No. 14153977.5, Extended European Search Report dated May 30, 2014, 11 pages.
Partial English Translation and Abstract of Japanese Patent Application No. JPA2006019514, Mar. 11, 2016, 59 pages.
Partial English Translation and Abstract of Japanese Patent Application No. JPA2006210581, Mar. 11, 2016, 56 pages.
Partial English Translation and Abstract of Japanese Patent Application No. JPA2007299773, Mar. 11, 2016, 33 pages.
Partial English Translation and Abstract of Japanese Patent Application No. JPA2009094117, Mar. 11, 2016, 63 pages.
Foreign Communication From A Counterpart Application, Japanese Application No. 2015-020050, Japanese Office Action dated Feb. 23, 2016, 6 pages.
Foreign Communication From A Counterpart Application, Japanese Application No. 2015-020050, English Translation of Japanese Office Action dated Feb. 23, 2016, 7 pages.

* cited by examiner

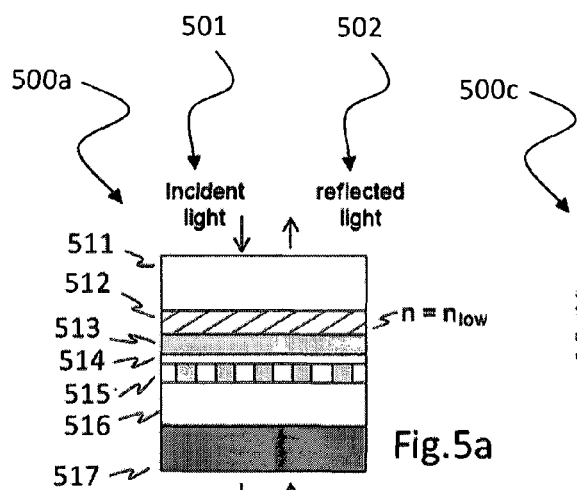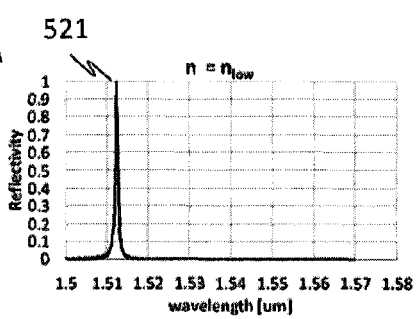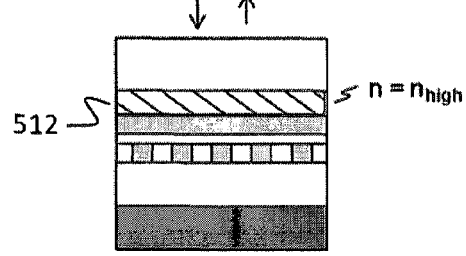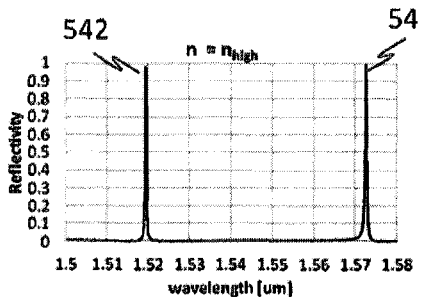
Fig.5b       Fig.5d

OPTICAL LASING DEVICE AND METHOD FOR GENERATING A LASING MODE IN SUCH DEVICE

CROSS-REFERENCE TO RELATED APPLICATIONS

This application claims priority to European Patent Application No. EP14153977.5, filed on Feb. 5, 2014, which is hereby incorporated by reference in its entirety.

TECHNICAL FIELD

The present disclosure relates to an optical lasing device and a method for generating a lasing mode in an optical lasing device. The disclosure further relates to the field of optical communications and in particular to Dense Wavelength Division Multiplexing (DWDM) systems.

BACKGROUND

The demand for increased bandwidth in fiber optic telecommunications has driven the development of sophisticated transmitter lasers usable for DWDM systems wherein multiple separate data streams propagate concurrently in a single optical fiber. Each data stream is created by the modulated output of a semiconductor laser at a specific channel frequency or wavelength, and the multiple modulated outputs are combined onto the single fiber. Telecom DWDM systems have largely been based on distributed feedback (DFB) lasers. To meet the demands for operation on the fixed grid of telecom wavelengths, also called the International Telecommunication Union (ITU) grid, DFBs have been augmented by external reference etalons and require feedback control loops. External cavity lasers have been developed to overcome the limitations of individual DFB devices.

The typical external cavity tunable laser design 100 as shown in FIG. 1 includes a gain medium 101 to provide light amplification, a periodic grid generator filter 103 (typically an etalon) to provide the correct channels frequency grid according to system specifications (typically C-band or L-band ITU frequency grid for DWDM systems), a channel selector filter 104 to be tuned with an appropriate tuning mechanism to select the lasing mode between the ones allowed by the channels grid and a collimating/adjusting lenses system 102 to provide the correct alignment and dimension of the collimated cavity beam. The cavity having a cavity length 110 is thus typically comprised between the end facet of the gain medium 101, which acts as the first mirror, and the channel selector element 104 which can work as the second mirror.

A design of such an external cavity laser can be found in U.S. Pat. No. 6,704,332 B2, where the channel selector filter 104 is implemented as a tunable element to feed-back light of a selected wavelength to the gain medium 101.

A possible solution to guarantee single mode lasing can be found in WO 2004070893, where the tunable mirror is a Guided Mode Resonance (GMR) mirror with a reflection peak that can be tuned by means of a suitable mechanism, which can be either electrical or thermal tuning of optical properties of one or more materials included in the GMR mirror structure. Practically, the effective gain range (EGR) of the gain medium is generally much wider than the required DWDM channels range, over which the channel selector element is required to be tunable. The gain profile also depends on the driving current, so a possible situation is that high gain is present at wavelengths outside the channels range. The tunable mirror described in WO 2004070893 does not have an infinite Free Spectral Range (FSR), thus besides the main reflection peak that can be used to select the channels over the grid, it always has secondary reflection peaks, and possibly a ground reflectivity noise. Both secondary peaks and ground noise can overlap outside the DWDM channels range with the etalon peaks to provide not negligible optical feedback.

FIG. 2 depicts a gain diagram 200 illustrating the gain 210 over wavelength of an external cavity laser that may generate a main lasing mode 201 and a secondary lasing mode 202. Due to the possible high gain outside the DWDM channels range 203, some unwanted lasing mode can arise in this frequency region, where secondary reflection peaks or ground reflectivity noise overlap with the etalon peaks. It results in an uncontrolled lasing frequency corresponding to longitudinal multimode oscillation of the laser cavity if the two modes, i.e., the main lasing mode 201 and the secondary lasing mode 202 as depicted in FIG. 2 are comparable in terms of gain/loss balance. This effect is much more critical when some frequency detuning exists between the etalon and the tunable mirror peaks as, for example, during the switch on procedure, in which the relative frequency alignment between the etalon and the tunable mirror is not actively controlled and thus the optical power feedback provided by the tunable mirror main reflection peak (corresponding to the main lasing mode 201), might be comparable with the one provided by the secondary peak, which allows the oscillation of the secondary lasing mode 202. Also, unwanted lasing modes can be excited by spurious reflections which can occur outside the channels range 203.

SUMMARY

It is the object of the invention to provide an improved External Cavity Laser design capable of stable single mode lasing operation over a specified wavelength grid.

This object is achieved by the features of the independent claims. Further implementation forms are apparent from the dependent claims, the description and the figures.

The invention is based on the finding that by the introduction of a filter element inside the laser cavity the problem of multimode oscillation in external cavity lasers where the selective tunable element is a GMR mirror can be solved. This filter element is a band-pass filter which allows avoiding the multimode oscillation without applying severe limitations on the GMR tunable mirror performances. In particular, for the GMR mirror, the tuning efficiency must be limited by design and the fabrication complexity has to be potentially increased in order to overcome the multimodal oscillation of the cavity due to secondary reflection peaks or spurious reflections. The new design comprising the band-pass filter allows stable single mode lasing operation over a specified wavelength grid and does not affect the optimal performances of the GMR mirror.

In the following, a periodic grid generator filter, e.g. implemented as an Etalon is described. The Etalon is a periodic filter, which provides transmission peaks with constant frequency spacing over a spectral range which may be very large, for example some hundreds of nanometers (nm). Hence, some good overlap between etalon peaks and cavity modes can be seen also outside the required channels band which may be defined by the system, i.e., ITU C-band or L-band for example, in a region where the gain of the medium gain is still high.

The band-pass filter as presented in this disclosure may thus provide a finite pass band to the etalon (which is as wide as the required laser channels band) in order to avoid overlap with cavity modes in unwanted wavelength regions.

In order to describe the invention in detail, the following terms, abbreviations and notations will be used:
DWDM: dense wavelength division multiplexing,
DFB: distributed feedback,
GMR: Guided Mode Resonance mirror,
EGR: effective gain range,
FSR: free spectral range,
AR: anti-reflection,
ITU: International Telecommunication Union.

According to a first aspect, the invention relates to an optical lasing device comprising a gain medium arranged in a lasing cavity having an optical axis, the gain medium providing light amplification; a periodic grid generator filter arranged in the lasing cavity; a channel selector arranged in the lasing cavity and configured to select a lasing mode of the amplified light corresponding to a frequency channel defined by the periodic grid generator filter according to an optimization criterion; and a band-pass filter arranged in the lasing cavity and configured to suppress lasing modes which are outside of a pass-band of the band-pass filter.

The band-pass filter selects the range of wavelengths, which is the range on which the tuning of the laser can be achieved, and suppresses wavelengths outside this range. This allows a significant improvement of the tuning element (tunable mirror), i.e. the channel selector performances, if the tuning element has non-infinite FSR (multiple reflection peaks) or non-negligible ground reflectivity. By the introduction of the band-pass filter all these problems are overcome and strict design constraints can be removed, making the tunable mirror more efficient and less complex.

In a first possible implementation form of the optical lasing device according to the first aspect, the optimization criterion comprises tuning the channel selector within a frequency channel range such that a single lasing mode arises at a frequency corresponding to one channel of the periodic grid generator filter.

When the channel selector is tuned within a frequency channel range such that a single lasing mode arises at a frequency corresponding to one channel of the periodic grid generator filter, a strong and adjustable lasing mode can be selected within a channels range according to a specification, in particular within a C-band or L-band according to ITU specification.

In a second possible implementation form of the optical lasing device according to the first aspect as such or according to the first implementation form of the first aspect, the pass-band of the band-pass filter is configured to coincide with a channels range according to a specification, in particular with a C-band or L-band according to ITU specification.

When the pass-band of the band-pass filter corresponds to the frequency channel range of the periodic grid generator filter, the lasing device can be operated stable and robust in the required frequency band.

In a fourth possible implementation form of the optical lasing device according to the first aspect as such or according to any of the previous implementation forms of the first aspect, the channel selector comprises a GMR tunable mirror.

A GMR tunable mirror is able to be tuned with an appropriate tuning mechanism to accurately select the lasing mode between the ones allowed by the channels grid.

In a fifth possible implementation form of the optical lasing device according to the fourth implementation form of the first aspect, the GMR tunable mirror comprises at least one active layer having a tunable refractive index which is tunable between a first value and a second value higher than the first value.

The active layer of the GMR tunable mirror allows by tuning of the refractive index of the active layer to tune the resonant peak position to cover the entire required channels band, e.g. the full C-band or L-band as specified by ITU.

In a sixth possible implementation form of the optical lasing device according to the fifth implementation form of the first aspect, the second value of the tunable refractive index is such that at least two different waveguide modes are generated in the at least one active layer corresponding to at least two different reflection peaks.

An active layer or a tunable layer as described in this specification refers to a tunable layer in which different waveguide modes may be tunable generated depending on the refractive index of the tunable layer, e.g. layer 512 as described below with respect to FIG. 5. A waveguide layer as described in this specification refers to a layer in which a main waveguide mode may be generated, e.g. layer 513 as described below with respect to FIG. 5. When the refractive index of the tunable layer is raised from an initial value, other waveguide modes can be generated in that layer.

Keeping the secondary peak below the EGR edge results in a main peak limited tuning; when the secondary peak is allowed to arise below the EGR edge up to the edge of the specified channels band, the main peak is much more tunable.

By applying voltage, the refractive index of the liquid crystal changes. In principle, a strong tuning of the refractive index is desirable from the liquid crystal material in order to have a main reflection peak capable of covering the whole channels band with a limited tuning force. However, a strong tuning may also result in raising of secondary reflections in a spectral region comprised in the EGR, where a secondary lasing mode can be excited and can oscillate in the cavity. The band-pass filter allows raising the LC index over a certain value without the drawback of having secondary modes located inside the high gain region, because they are suppressed by the filter.

In a seventh possible implementation form of the optical lasing device according to the sixth implementation form of the first aspect, the GMR tunable mirror is configured to generate the at least two different reflection peaks within a spectral range of the gain medium.

When two different reflection peaks are generated within the EGR range of the gain medium, the refractive index is above a certain value allowing better tuning of the main peak. A high value of the refractive index and of the layer thickness provides effective tuning of the main waveguide mode effective index.

In an eighth possible implementation form of the optical lasing device according to the sixth implementation form or according to the seventh implementation form of the first aspect, the GMR tunable mirror is configured to generate a main peak of the at least two reflection peaks within a specified channels range and to generate a secondary peak of the at least two different reflection peaks outside the specified channels range.

The arising of the secondary peak allows better tuning of the main peak. The instable behavior of the lasing device caused by the arising of the secondary peak can be avoided by using the band-pass filter that filters out the secondary peak and thus stabilizes the lasing device.

In a ninth possible implementation form of the optical lasing device according to the eighth implementation form of the first aspect, the GMR tunable mirror is configured to generate the secondary peak of the at least two different reflection peaks at an edge of the specified channels range.

When the secondary peak is allowed to move up until the edge of the specified channels range, in particular the channels range specified by the ITU C-band or L-band, the tuning performance of the lasing device is optimized. At the band edges, the band-pass filter stop-band filters out undesired peaks.

In a tenth possible implementation form of the optical lasing device according to any one of the fifth implementation form to the ninth implementation form of the first aspect, the at least one active layer of the GMR tunable mirror comprises a nematic liquid crystal layer.

The nematic liquid crystal layer consists of highly birefringent molecules which effectively change the refractive index by applying an electric field. Thus, changing of refractive index can be easily and precisely achieved.

In an eleventh possible implementation form of the optical lasing device according to any one of the fourth implementation form to the tenth implementation form of the first aspect, the GMR tunable mirror comprises at least one antireflection (AR) layer configured to operate only over the pass-band of the band-pass filter.

AR layers must be introduced inside the structure of the GMR tunable mirror because, apart from the mirror peak, a low reflectance value is desirable over all its reflection spectrum in order to avoid that other lasing modes are excited beside the one selected by the main peak. AR design implies a certain number of layers used to create destructive interference over a certain bandwidth by means of Fresnel reflection. The performances of the AR layers, in terms of residual reflectance value and bandwidth, depend on the materials used for AR design and on the numbers of the AR layers.

If a band-pass filter is introduced in the cavity, the AR layers can be designed to work only over the limited bandwidth of the filter pass-band, implying a lower number of fabrication steps (layers), or providing much better performances with the same number of layers.

In a twelfth possible implementation form of the optical lasing device according to the first aspect as such or according to any of the previous implementation forms of the first aspect, the band-pass filter is integrated with a cavity length tuning element in the lasing cavity.

The integration of the band-pass filter with some of the other elements in the cavity, e.g. the cavity tuning element, saves space inside the cavity. The integration of the band-pass filter with the cavity length tuning element is very convenient because it does not require more space in the cavity, and it can be achieved with low cost fabrication techniques, e.g. thin film deposition on wafer scale.

In a thirteenth possible implementation form of the optical lasing device according to the twelfth implementation form of the first aspect, the cavity length tuning element is tilted in the lasing cavity such that light having a frequency out of the pass-band is reflected away from the lasing cavity.

When integrating the band-pass filter with a tilted element, e.g. the cavity length tuning element, the light having frequency out of the pass-band of the band-pass filter may be reflected away from the cavity, thus not providing unwanted feedback.

According to a second aspect, the invention relates to a method for generating a lasing mode in an optical lasing device, the method comprising arranging a gain medium in a lasing cavity having an optical axis, the gain medium providing light amplification; arranging a periodic grid generator filter in the lasing cavity; arranging a channel selector in the lasing cavity, the channel selector being configured to select a lasing mode corresponding to a frequency defined by the periodic grid generator filter according to an optimization criterion; and arranging a band-pass filter in the lasing cavity, the band-pass filter being configured to suppress lasing modes which are outside of a pass-band of the band-pass filter.

The method avoids a multimode cavity oscillation without introducing the drawbacks of reduced tuning efficiency of the channel selector tuning mirror and without increasing the complexity of device fabrication.

According to a third aspect, the invention relates to an external cavity laser apparatus, comprising a gain medium configured to emit a light beam; a tunable element configured to receive the light beam and to feedback light of a selected wavelength to the gain medium; a filter element positioned between the gain medium and the tunable element; the tunable element being configured to provide selection of the selected wavelength within a given range of wavelengths; and the filter element being configured to operate as a band-pass filter for suppressing lasing at wavelengths outside the given range of wavelengths.

Using the band-pass filter provides an external cavity laser apparatus capable of stable single mode lasing operation over a specified wavelength grid. By the use of the band-pass filter, a secondary reflection peak may be allowed to move up to the limit of the channels band allowing the main peak to be much more tunable covering the whole channels band with a reduced tuning force, i.e. with reduced applied voltage.

In a first possible implementation form of the external cavity laser apparatus according to the third aspect, the tunable element is a GMR tunable mirror.

A GMR tunable mirror is able to be tuned with an appropriate tuning mechanism to accurately select the lasing mode between the ones allowed by the given range of wavelengths.

In a second possible implementation form of the external cavity laser apparatus according to the third aspect, the external cavity laser apparatus further comprises a cavity length tuning element positioned between the gain medium and the tunable element.

The cavity length tuning element is very useful to control the lasing mode frequency.

In a third possible implementation form of the external cavity laser apparatus according to the second implementation form of the third aspect, the cavity length tuning element is directly coupled with the filter element.

When the cavity length tuning element is directly coupled with the filter element, both elements can be produced with low additional cost and negligible cavity space occupation. For example, thin film coatings can be used to fabricate the filter element on the tuning element in order to reduce manufacturing costs and cavity space occupation.

In a fourth possible implementation form of the external cavity laser apparatus according to the third aspect as such, the external cavity laser apparatus further comprises a grid generator element configured to align the selected wavelength according to pre-determined system channel spacing requirements.

The grid generator allows meeting the ITU requirement of DWDM systems. Hence the external cavity laser can be efficiently applied in telecommunication systems.

BRIEF DESCRIPTION OF THE DRAWINGS

Further embodiments of the invention will be described with respect to the following figures, in which:

FIGS. 5a-5d show schematic and spectral diagrams of GMR tunable mirrors;

DETAILED DESCRIPTION

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

The devices and methods described herein may be based on optical lasing devices such as external cavity lasers. It is understood that comments made in connection with a described method may also hold true for a corresponding device configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
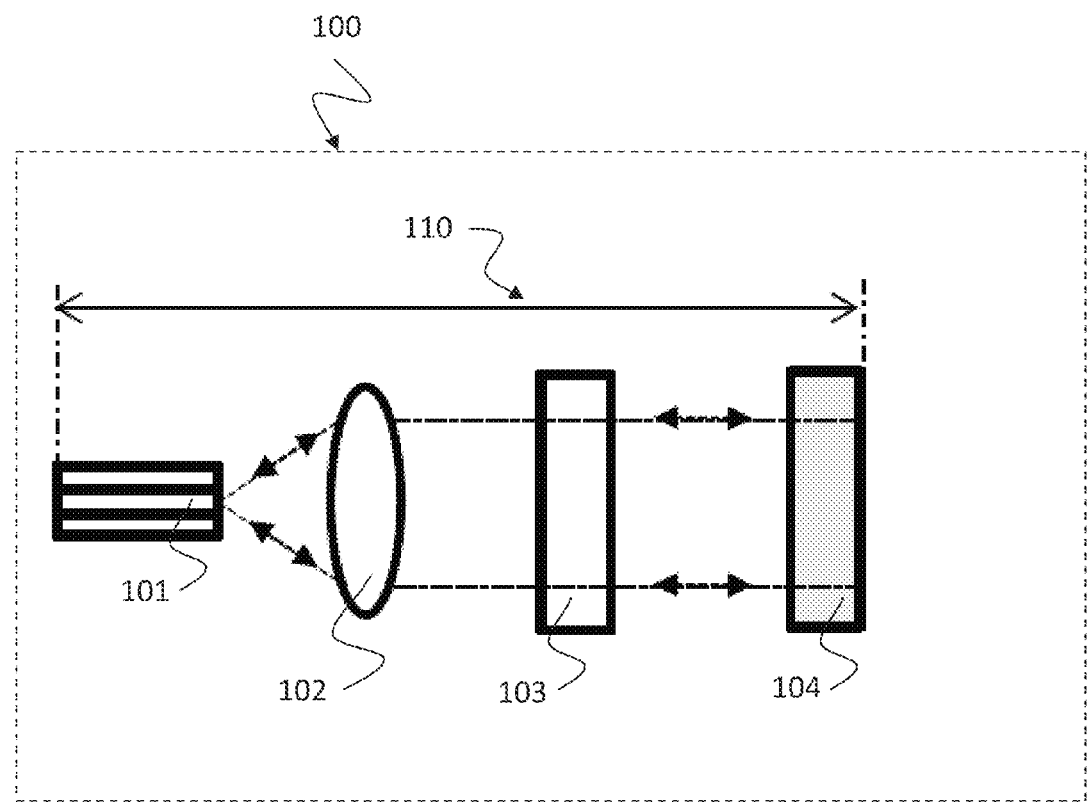
FIG. 1 shows a block diagram illustrating a currently used external cavity tunable laser design.
Figure 2:
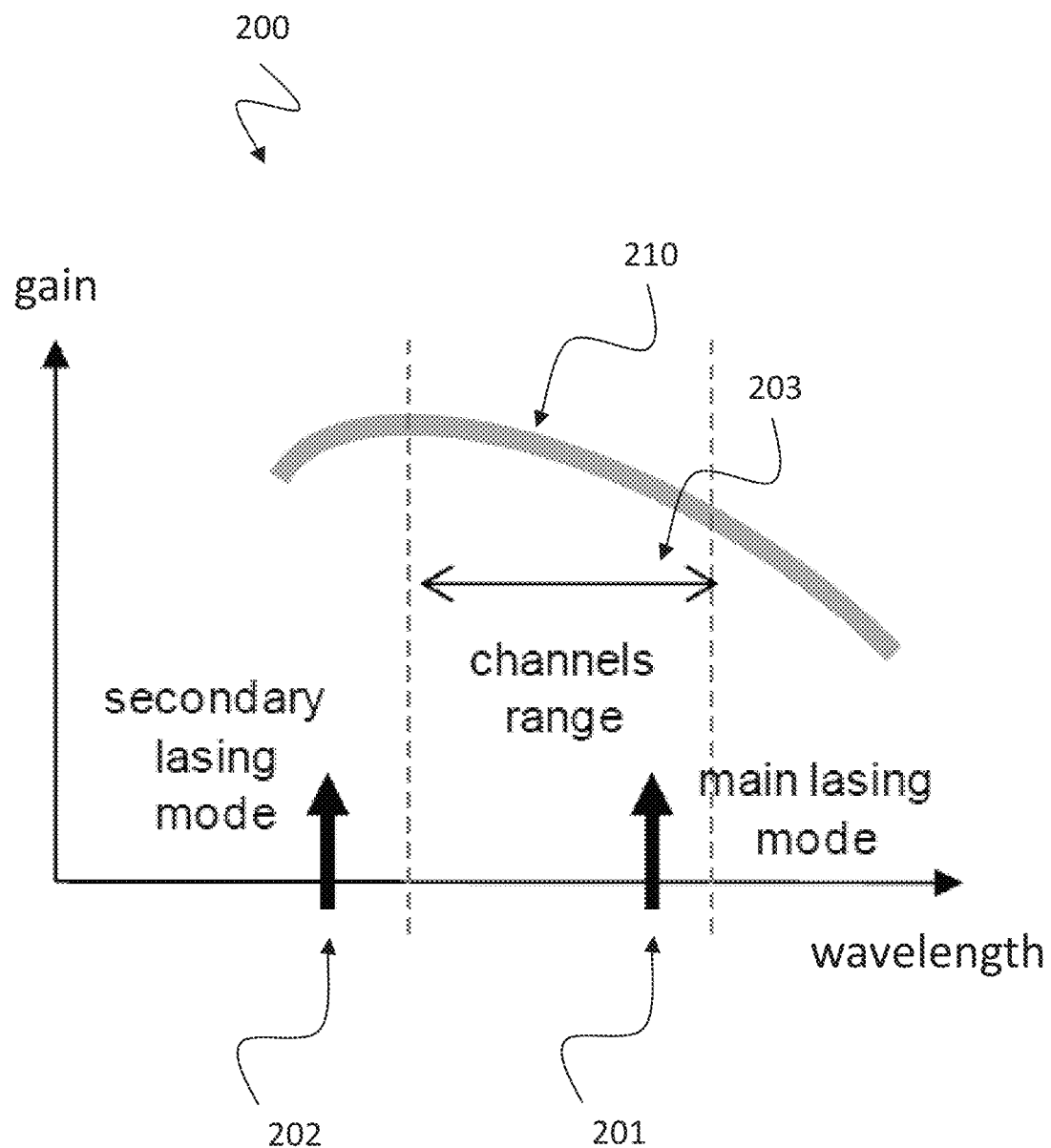
FIG. 2 shows a gain diagram illustrating the gain over wavelength of an external cavity laser design as depicted in FIG. 1.
Figure 3:
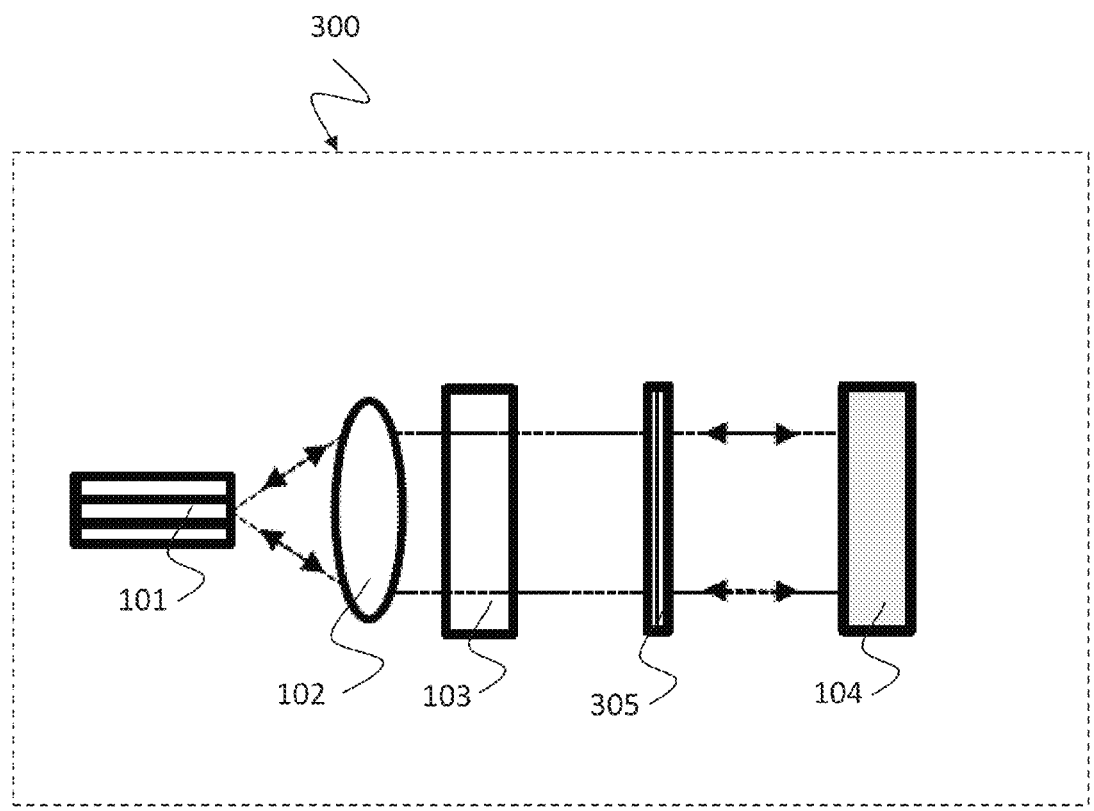
FIG. 3 shows a block diagram illustrating one example of an optical lasing device including a band-pass filter according to an implementation form.

FIG. 3 shows a block diagram illustrating one example of an optical lasing device 300 including a band-pass filter 305 according to an implementation form. The optical lasing device 300 may include a gain medium 101 arranged in a lasing cavity having an optical axis. The gain medium 101 may provide light amplification. The optical lasing device 300 may include a periodic grid generator filter 103 arranged in the lasing cavity. The optical lasing device 300 may include a channel selector 104 arranged in the lasing cavity and configured to select a lasing mode of the amplified light corresponding to a frequency defined by the periodic grid generator filter 103 according to an optimization criterion. The optical lasing device 300 may include a band-pass filter 305 arranged in the lasing cavity and configured to suppress lasing modes which are outside of a pass-band of the band-pass filter 305.

The band-pass filter 305 may be used for spectral filtering of the light inside the cavity. If the pass-band is designed to coincide with the channels wavelength range no secondary lasing mode outside this range may arise because their frequencies are contained in the stop-band of the band-pass filter 305 and then suppressed by the band-pass filter 305.

In an implementation of the optical lasing device 300, the optimization criterion includes tuning the channel selector such that a single lasing mode within a specified channels range arises. In an implementation of the optical lasing device 300, the pass-band of the band-pass filter 305 is configured to coincide with a channels range according to a specification, in particular with a C-band or L-band according to ITU specification. In an implementation of the optical lasing device 300, the channel selector 104 comprises a GMR tunable mirror. In an implementation of the optical lasing device 300, the GMR tunable mirror comprises at least one active layer having a tunable refractive index which is tunable between a first value and a second value higher than the first value as described below with respect to FIG. 5. In an implementation of the optical lasing device 300, the second value of the tunable refractive index is such that at least two different waveguide modes are generated in the at least one active layer, i.e. in a tunable layer such as layer 512 described below with respect to FIG. 5, after the main waveguide mode has been generated in the waveguide layer such as layer 513 described below with respect to FIG. 5. The at least two different waveguide modes are corresponding to at least two different reflection peaks. In an implementation of the optical lasing device 300, the GMR tunable mirror is configured to generate the at least two different reflection peaks within a spectral range of the gain medium. In an implementation of the optical lasing device 300, the GMR tunable mirror is configured to generate a main peak of the at least two reflection peaks within a specified channels range and to generate a secondary peak of the at least two different reflection peaks outside the specified channels range. In an implementation of the optical lasing device 300, the GMR tunable mirror is configured to generate the secondary peak of the at least two different reflection peaks at an edge of the specified channels range. In an implementation of the optical lasing device 300, the at least one active layer of the GMR tunable mirror comprises a nematic liquid crystal layer. In an implementation of the optical lasing device 300, the GMR tunable mirror includes at least one AR layer configured to operate only over the pass-band of the band-pass filter 305.

Figure 4:
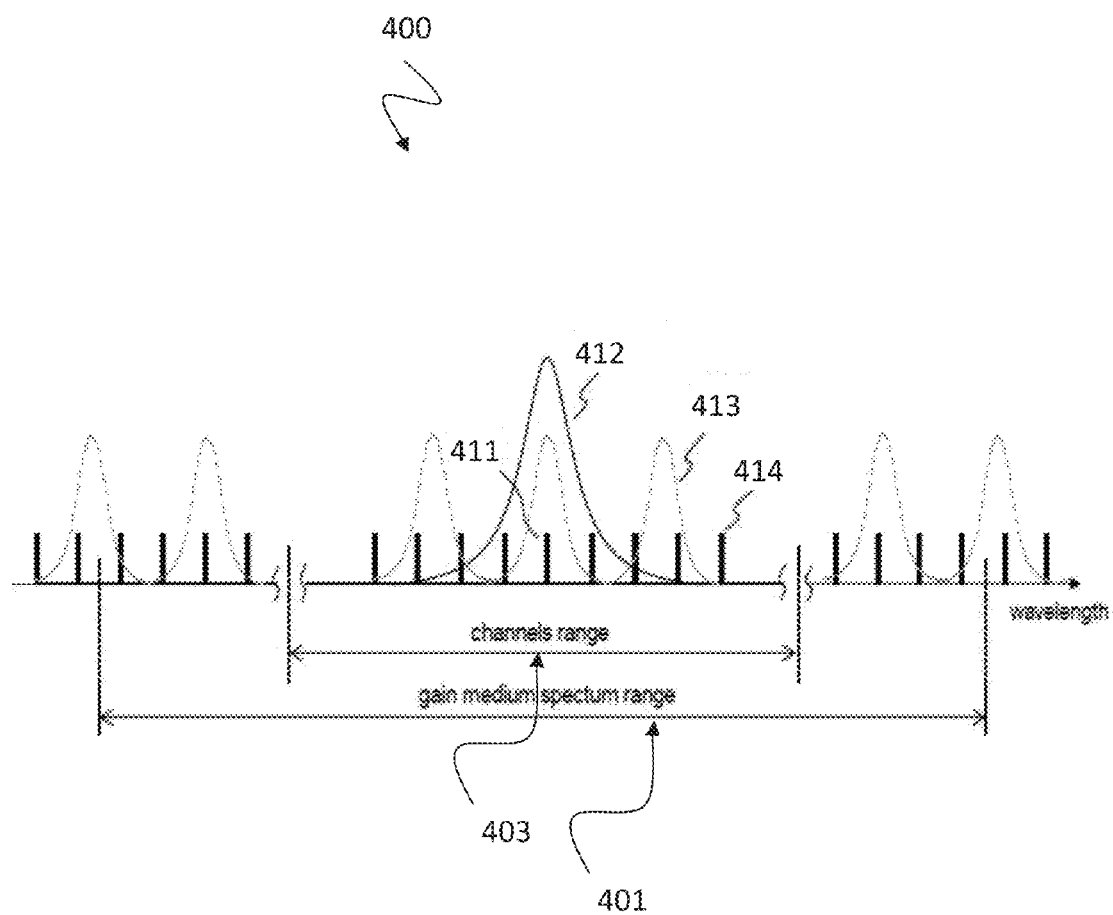
FIG. 4 shows a spectral diagram illustrating a single mode lasing operation.

FIG. 4 shows a spectral diagram 400 illustrating a single mode lasing operation. In an external cavity laser 300 as described above with respect to FIG. 3, the single mode lasing operation is achieved by an accurate active alignment of the cavity elements spectra according to an optimization criterion so to have the lasing gain/loss balance condition fulfilled for only one cavity mode or lasing mode 411, as shown in FIG. 4. It is clear from the figure that only one lasing mode 411 can be supported by the cavity, the one corresponding to the lowest loss, i.e. the one aligned with one etalon peak 413 and with the tunable mirror main peak 412.

FIG. 4 also depicts Fabry Perot cavity modes 414.

FIGS. 5a and 5b show schematic diagrams 500a, 500b illustrating one example of a GMR tunable mirror 104 used in the optical lasing device 300 depicted in FIG. 3 according to an implementation form.

As stated before, a convenient choice is to design the tunable element 104 as a GMR mirror. In this kind of device, the tuning principle relies on the tuning of the refractive index of one or more layers of the GMR structure to tune the resonant peak position to cover the entire required channels band which may be the C-band or L-band as specified by ITU. FIGS. 5a and 5b show simplified structures of the GMR tunable mirror 104. The GMR tunable mirror 104 includes on a substrate 517 the following layers: a buffer layer 516, a grating layer 515, a gap layer 514, a waveguide layer 513, a tunable layer 512 and a glass layer 511. At least one layer 512 with tunable refractive index (n) may be included. The refractive index may be tuned between a low value $n_{low}$ and a high value $n_{high}$, thus tuning the reflection peak spectral position in order to reach at least the first and the last channel of the specified wavelength range. Incident light 501 falls on the glass layer 511. After refraction into the glass layer 511, reflected light 502 is reflected from the GMR tunable mirror 104.

FIGS. 5c and 5d show spectral diagrams 500c, 500d of the GMR tunable mirror structure 104 as depicted in FIGS. 5a and 5b. When the refractive index of the tunable layer 512 is set to the low value $n_{low}$, the structure may have one waveguide mode corresponding to a main peak 521 as depicted in FIG. 5c. When the refractive index of the tunable layer 512 is set to the high value $n_{high}$, the layer becomes a waveguide itself resulting in the structure having two different waveguide modes, i.e. main waveguide mode and tunable layer mode for which the resonance condition:

$$\lambda = \Lambda n_{\mathit{eff}} \quad (1)$$

is satisfied at two different wavelengths, corresponding to two different reflection peaks, a main peak 541 and a secondary peak 542 as depicted in FIG. 5d.

Figure 6:
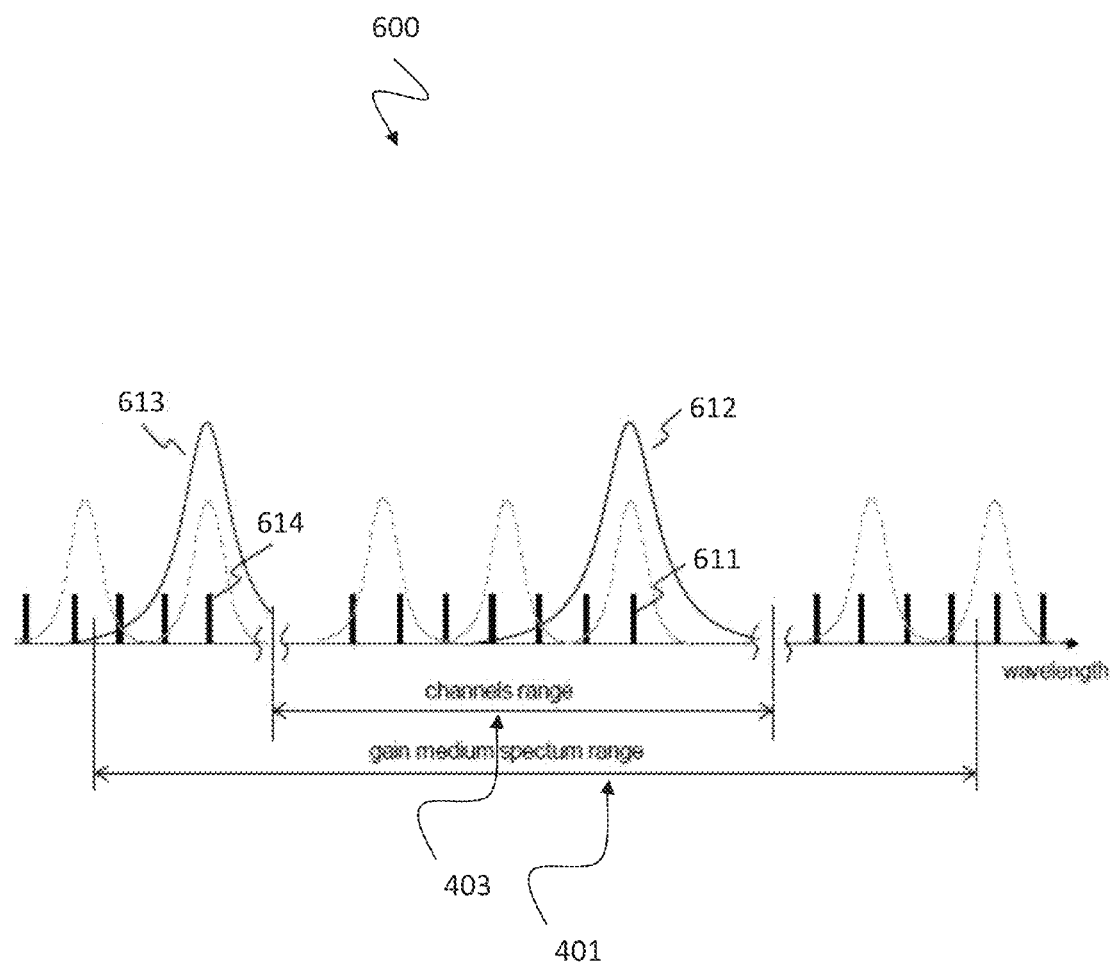
FIG. 6 shows a spectral diagram illustrating operation of an optical lasing device with a main and a secondary lasing mode according to an implementation form.

FIG. 6 shows a spectral diagram 600 illustrating operation of an optical lasing device with a main 611 and a secondary 614 lasing mode according to an implementation form.

The rising of the second reflectivity peak as described above with respect to FIGS. 4 and 5 has some impact on the lasing mode selection condition inside the cavity, as it can be seen from FIG. 6. The gain/loss balance condition can be fulfilled for a secondary lasing mode 614 located in the spectral range comprised between the lower ends of the channels 403 and the gain medium bands 401. There, if the gain has a peak, as it occurs in many practical situation at certain temperature and injection current values, this secondary lasing mode 614 can arise resulting in an uncontrolled lasing wavelength and cavity instability.

Without the band-pass filter 305 described above with respect to FIG. 3, the solution to avoid secondary lasing mode oscillation may be to prevent the related tunable mirror mode from having an effective refractive index so high that corresponds to a resonance condition at undesired wavelengths. In other words, the effective refractive index of the secondary mode must be kept below a certain value so that the related resonance condition (1) occurs at wavelengths lower than the EGR edge of the gain medium 101, i.e. outside the gain medium spectrum range 401. This may be achieved, for example, by reducing the tunable layer thickness or lowering of the value of $n_{high} - n_{low}$, i.e the birefringence, by an appropriate material choice.

On the other hand the tunable layer is also the cladding layer for the main waveguide structure, thus a high value of $n_{high}$ and layer thickness are desirable for effective tuning of the main waveguide mode effective index. Then a design trade-off must be found unless the band-pass filter 305 is applied.

Figure 7:
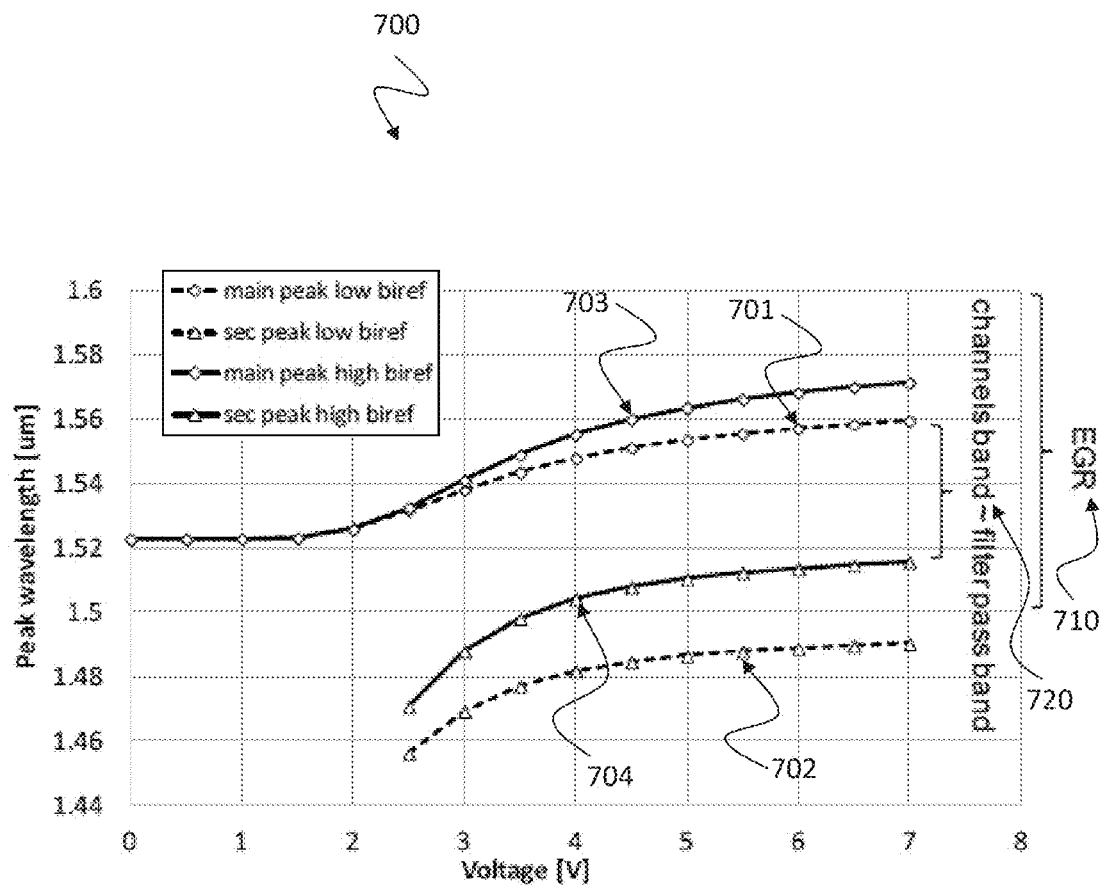
FIG. 7 shows a wavelength diagram illustrating one example of main and secondary peak occurrence as a function of the voltage applied to the tunable layer of a GMR tunable mirror according to an implementation form.

FIG. 7 shows a wavelength diagram 700 illustrating one example of main and secondary peak occurrence as a function of the voltage applied to the tunable layer of a GMR tunable mirror according to an implementation form. The wavelengths at which the main and the secondary reflectivity peak occur are plotted as a function of the voltage applied to the tunable layer. In one embodiment this may be a nematic liquid crystal layer, whose refractive index changes between $n_{low}$ and $n_{high}$ because of the orientation of its highly birefringent molecules induced by an electric field. Birefringence is defined as follows:

$$\Delta n = n_{high} - n_{low} \quad (2)$$

Given a tunable layer thickness, two different liquid crystal blends, thus two different birefringence values $\Delta n_1 > \Delta n_2$, are considered. Curve 701 depicts the main peak tuning plot in case of low birefringence value $\Delta n_2$. Curve 702 depicts the secondary peak low birefringence value $\Delta n_2$. Curve 703 depicts the main peak high birefringence value $\Delta n_1$. Curve 704 depicts the secondary peak high birefringence value $\Delta n1$. In the diagram, a channels band corresponding to the band-pass filter pass band 720 and the EGR band 710 is depicted.

As noticed above, keeping the secondary peak below the EGR edge may also result in a main peak 612 limited tuning. If the secondary reflection peak 613 is allowed to move up to the limit of the channels band 403 as depicted in FIG. 6, because of the presence of the band-pass filter 305, the main peak 612 may be much more tunable, covering the whole channels band with a reduced tuning force, i.e. a reduced applied voltage for this particular implementation. The same trend can be obtained by keeping the material properties fixed (in this particular case the birefringence) and changing the tunable layer thickness.

Figure 8A:
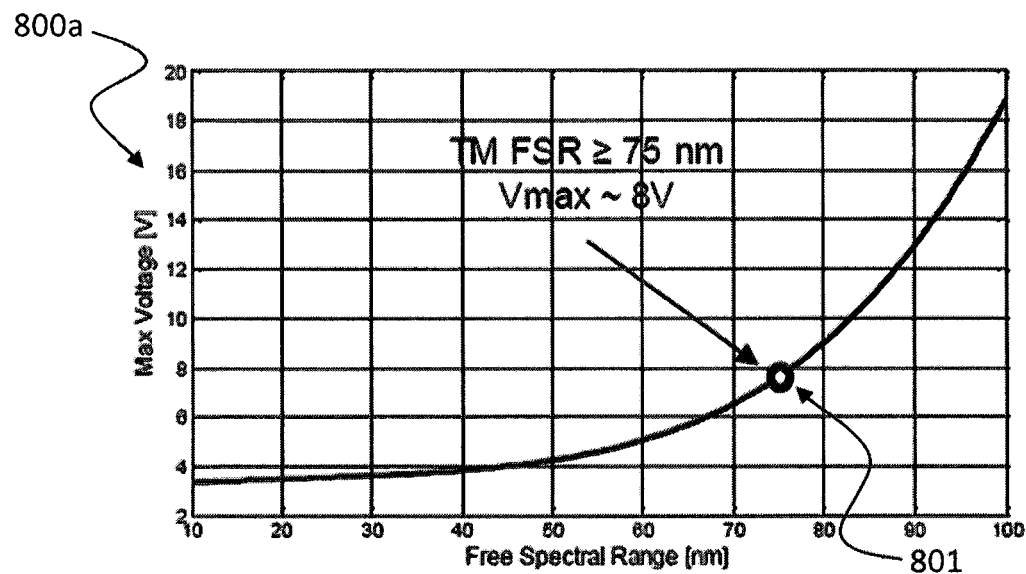
FIGS. 8a-8b show voltage diagrams illustrating an exemplary dependence of the tuning efficiency of the optical lasing device as a function of the GMR Tunable Mirror FSR.
Figure 8B:
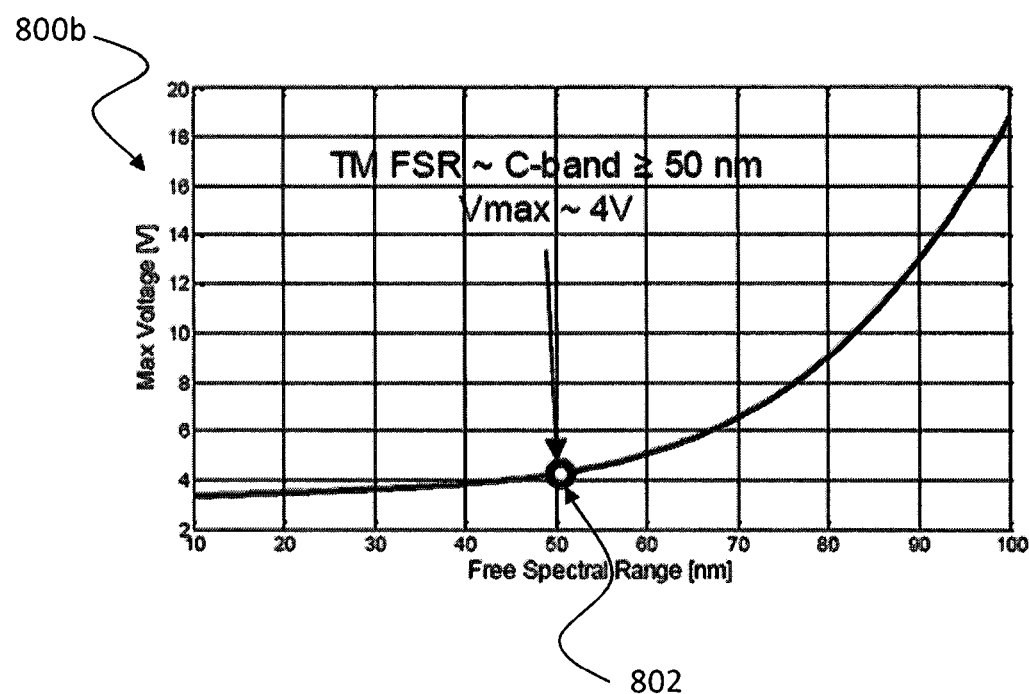

FIG. 8a shows a voltage diagram 800a illustrating an exemplary dependence of the tuning efficiency of the optical lasing device as a function of the GMR Tunable Mirror FSR when using an external cavity laser without band-pass filter. FIG. 8b shows a voltage diagram 800b illustrating an exemplary dependence of the tuning efficiency of the optical lasing device as a function of the GMR Tunable Mirror FSR when using an optical lasing device including a band-pass filter according to an implementation form.

FIG. 8a and FIG. 8b represent the dependence of the tuning efficiency of the external cavity laser 300 as a function of the GMR Tunable Mirror FSR. The GMR Tunable Mirror may not have a periodic response, but one main peak and possibly one or more secondary peaks may not be equally spaced. The FSR definition may not be applicable. However, for simplicity, it is kept to indicate the wavelength/frequency range comprised from the main peak and the first of the secondary.

The tuning efficiency is computed as the liquid crystal driving maximum voltage needed to cover all the C-band range or alternatively the L-band range. For this evaluation simplified values may be considered such as a 50 nm channels band range and 100 nm EGR. Without the use of a band-pass filter 305, given those values, the tunable mirror FSR may have to be kept above 75 nm, corresponding to a maximum needed voltage of 8 volts (V) as indicated by the circle 801 on diagram 800a. With the use of the band-pass filter 305, the FSR can be reduced down to 50 nm (to coincide with channels band), allowing the maximum voltage to be 4V as indicated by the circle 802 on diagram 800b, that is much lower than without the band-pass filter 305. The parameter changed here to obtain the different FSR values is the Liquid Crystal Birefringence Δn which can be usually chosen from a large number of commercial blends.

Figure 9A:
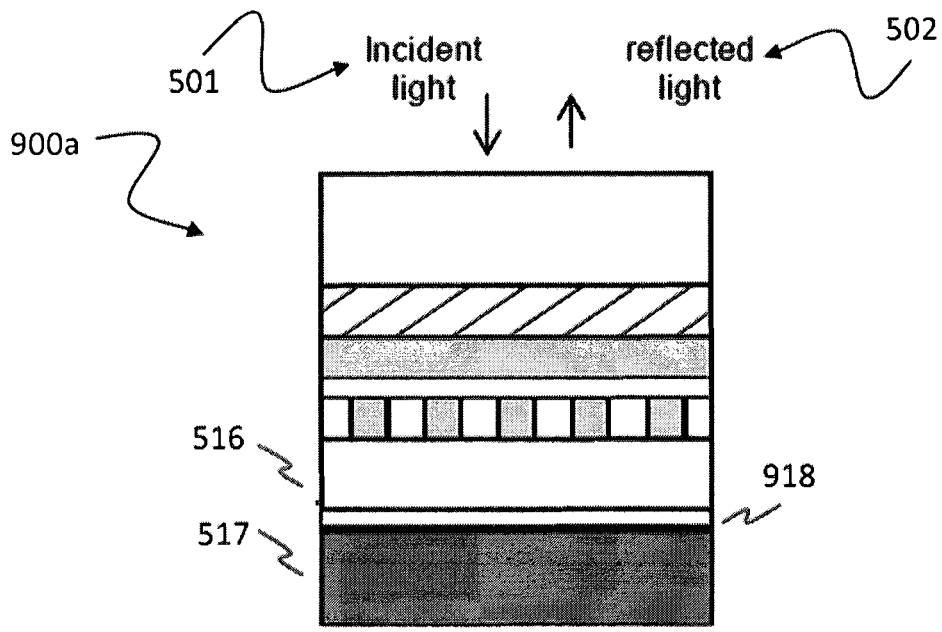
FIGS. 9a-9b show a schematic diagram illustrating one example of a GMR tunable mirror and an exemplary reflectivity spectrum of a GMR tunable mirror.

FIG. 9a shows a schematic diagram illustrating one example of a GMR tunable mirror 900a including AR layers 918 according to an implementation form.

Figure 9B:
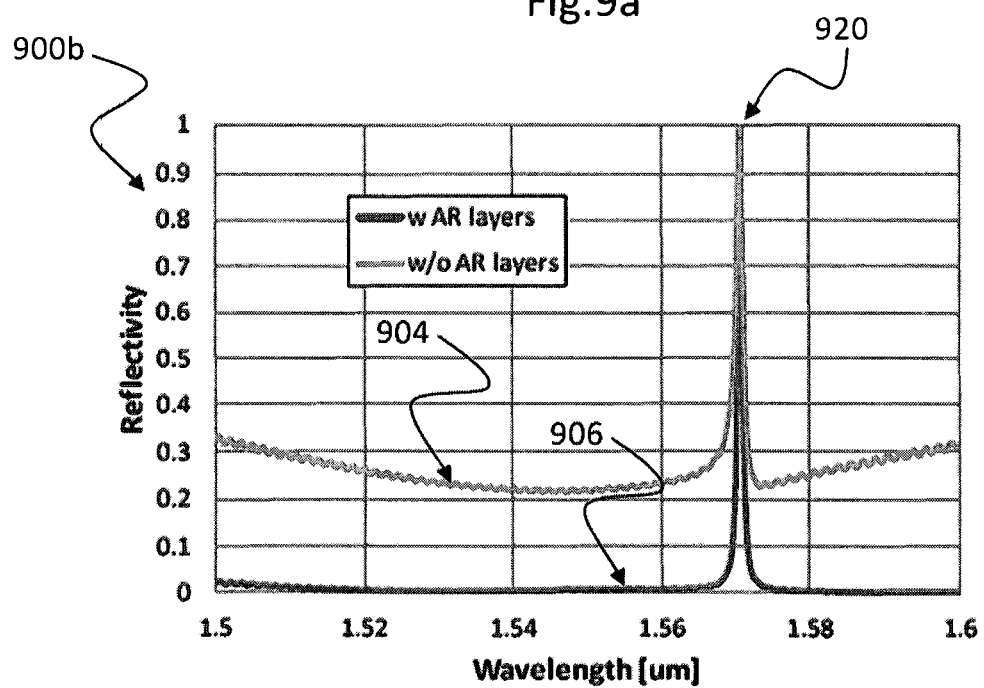

A further major advantage allowed by the introduction of the band-pass filter 305 inside the tunable laser cavity is related to the design and fabrication of the AR layers 918 of the GMR tunable mirror 900a as can be seen from the reflectivity spectrum depicted in FIG. 9b. The GMR tunable mirror 900a may have the same structure as described above with respect to FIGS. 5a and 5b but may include one or more AR layers 918.

FIG. 9b shows an exemplary reflectivity spectrum of a GMR tunable mirror without AR layers 904 and with AR layers 906 according to an implementation form.

AR layers 918 may be required in particular when a high refractive index substrate (i.e. silicon) is used for the tunable mirror, as in the optical lasing device 300 described above with respect to FIG. 3 for example. In order to optically isolate the high index substrate from the grating and waveguide layers a low refractive index buffer may be used, thus a significant optical impedance mismatch may be present at the buffer/substrate interface. This mismatch may result in unwanted ground level on the reflectivity spectrum outside the resonance region, as depicted in FIG. 9b.

AR layers may provide the matching between the high and low index materials. The total number of AR layers and the related thickness values may be designed starting from their refractive indices so to have destructive interference between all the reflected waves at the different interfaces. In FIG. 9a the first curve 904 shows the spectrum without AR layers and the second curve 906 shows spectrum with AR layers.

Figure 10:
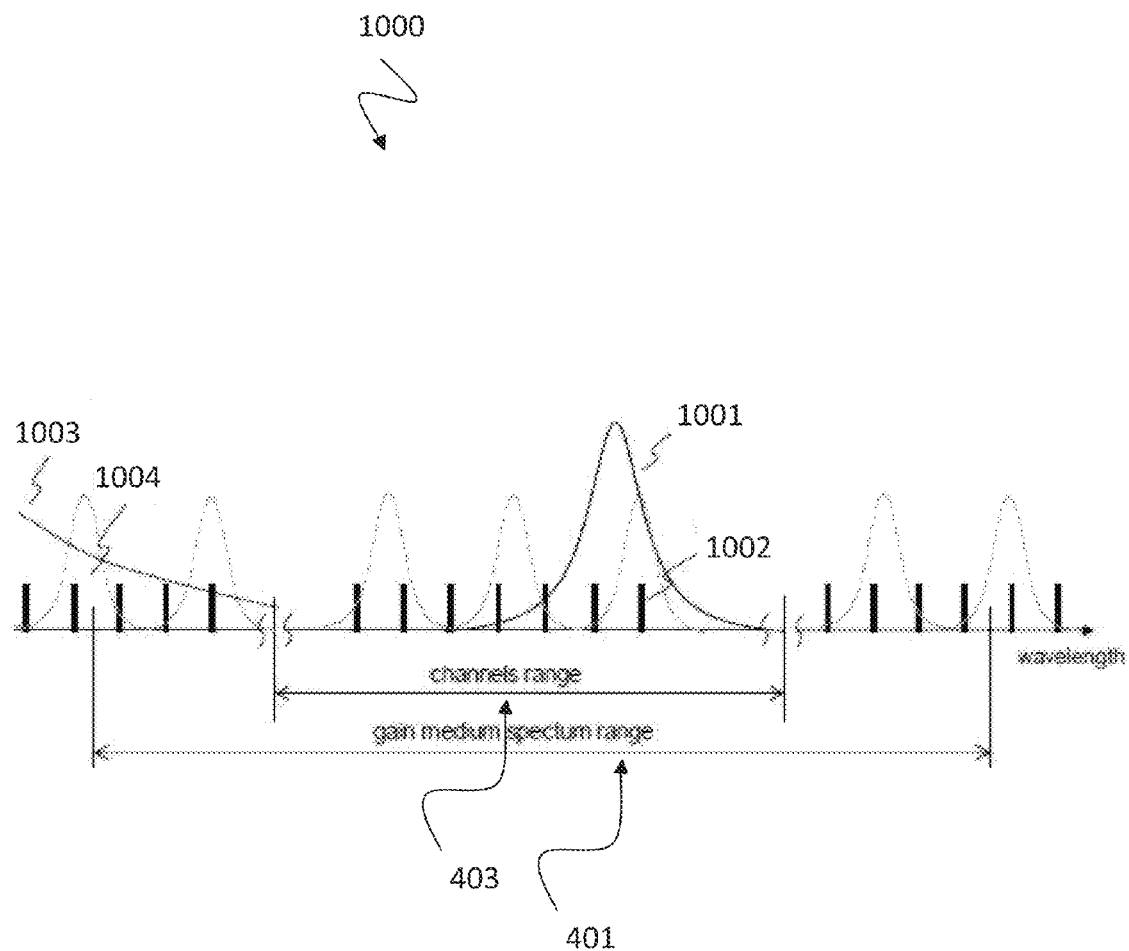
FIG. 10 shows a spectral diagram illustrating operation of an optical lasing device according to an implementation form in the presence of high ground reflectivity.

FIG. 10 shows a spectral diagram 1000 illustrating operation of an optical lasing device according to an implementation form in the presence of high ground reflectivity.

FIG. 10 illustrates the possible situation of high ground reflectivity 1003 of the tunable mirror. This can be due to the AR layers 918 as described in FIG. 9 not being optimized for the whole bandwidth or due to statistical deviation of the AR layers 918 thickness/refractive index as a result of fabrication tolerances, for example. In this situation a secondary lasing mode 1004 can arise if its gain/loss cavity balance is comparable with the one of the main lasing mode 1002. This can happen in particular during the switch on procedure, in which the relative frequency alignment between the etalon and the tunable mirror is not precise because it is not actively controlled and in general when frequency detuning between the etalon and the tunable mirror is present. Also if detuning is the desired working condition, this situation can apply severe limitations. From FIG. 10 can be seen that the main lasing mode 1002 is not aligned with the tunable mirror main peak 1001. The residual reflectance of the AR layers 918 and the AR bandwidth can be set by design but low reflectance values over a large bandwidth may require a complex AR layer structure 918 which may imply higher number of layers, thus fabrication steps, and lower fabrication tolerances.

Figure 11:
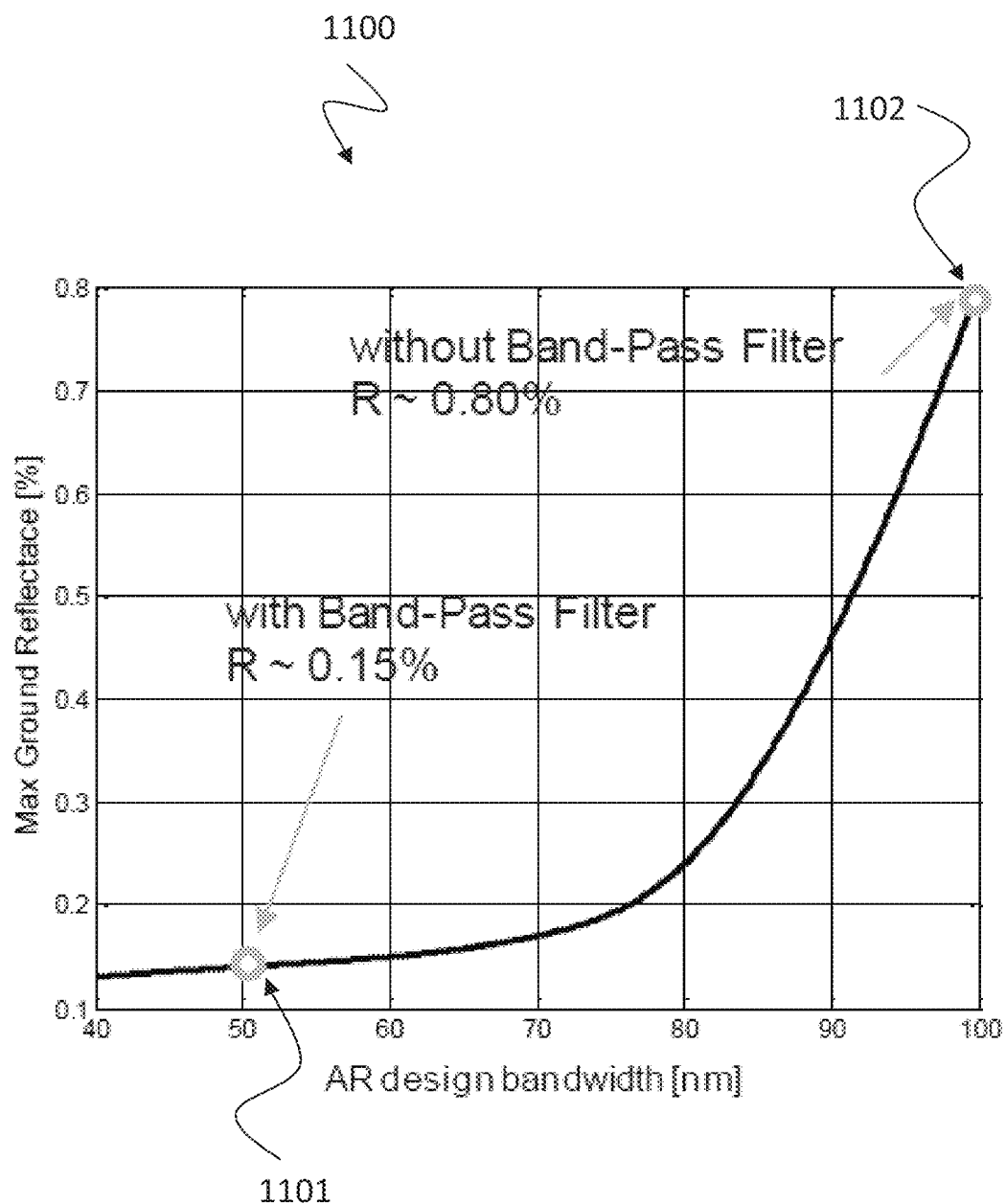
FIG. 11 shows an exemplary reflectivity spectrum illustrating ground reflectivity as a function of the bandwidth over which the AR layers are optimally designed for an optical lasing device with and without band-pass filter design.

FIG. 11 shows an exemplary reflectivity spectrum 1100 illustrating ground reflectance as a function of the bandwidth over which the AR layers are optimally designed for an optical lasing device with 1101 and without 1102 band-pass filter design. The ground reflectance noise, here the maximum value over the band is plotted as a function of the same bandwidth over which the AR layers design is optimized.

Considering the same 100 nm of EGR value, the AR coating may have to be designed to cover the whole band, if the band-pass filter 305 is not introduced. On the other hand, if a band-pass filter 305 having a bandwidth of 50 nm is introduced in the cavity, the design of the AR layers can be designed to work only over 50 nm, implying less number of fabrication steps (layers), or providing much better performances with the same number of layers.

As a result of the introduction of the band-pass filter 305, reflectance ground noise may be lowered from 0.80% to 0.15% without making the AR design more complex. If fabrication tolerances are taken into account, the improvement induced by the introduction of the band-pass filter may be even bigger.

Figure 12:
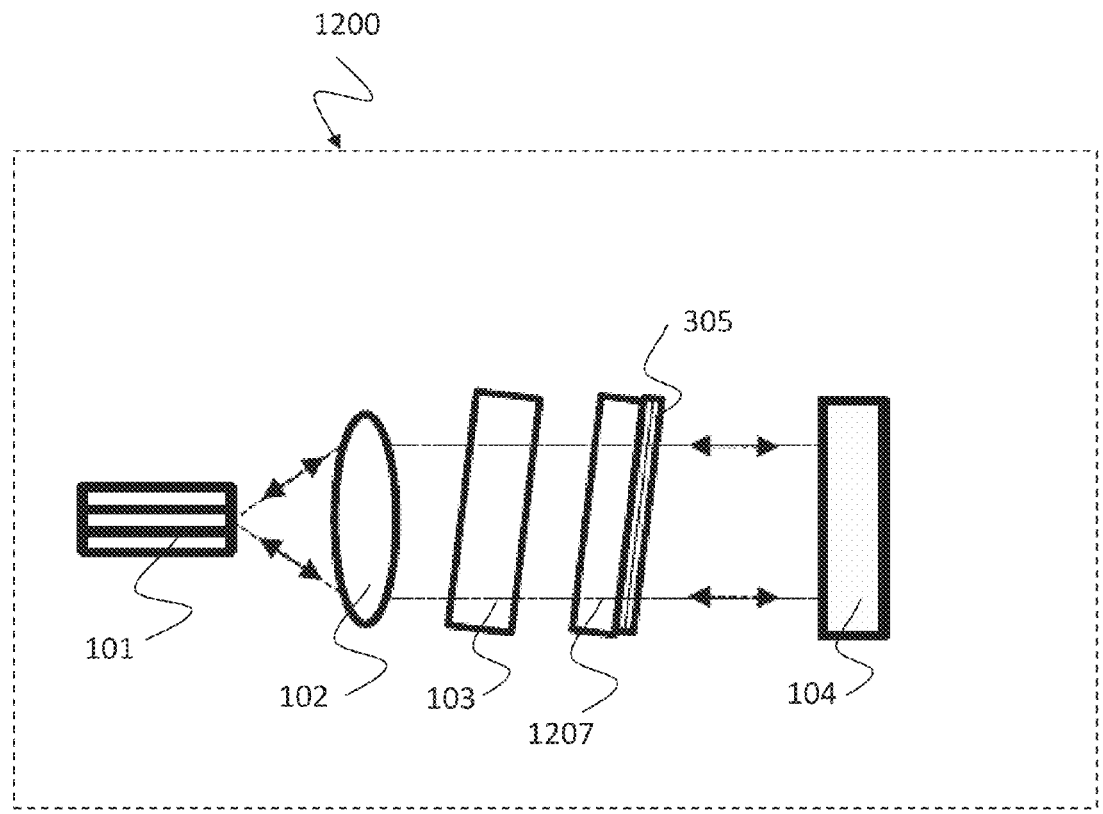
FIG. 12 shows a block diagram illustrating one example of an optical lasing device including a band-pass filter integrated with a cavity length tuning element according to an implementation form.

FIG. 12 shows a block diagram illustrating one example of an optical lasing device 1200 including a band-pass filter 305 integrated with a cavity length tuning element 1207 according to an implementation form. The optical lasing device 1200 may include a gain medium 101 arranged in a lasing cavity having an optical axis, the gain medium providing light amplification. The optical lasing device 1200 may include a periodic grid generator filter 103 arranged in the lasing cavity. The optical lasing device 1200 may include a channel selector 104 arranged in the lasing cavity and configured to select a lasing mode of the amplified light corresponding to a frequency channel defined by the periodic grid generator filter 103 according to an optimization criterion. The optical lasing device 1200 may include a band-pass filter 305 arranged in the lasing cavity and configured to suppress lasing modes which are outside of a pass-band of the band-pass filter. The band-pass filter 305 may be integrated with a cavity length tuning element 1207 in the lasing cavity.

In one example, the cavity length tuning element 1207 may be tilted in the lasing cavity together with the band-pass filter 305 such that light having a frequency out of the pass-band is reflected away from the lasing cavity. Integration of the band-pass filter 305 with some of the other elements in the cavity may save space inside the cavity.

In one example, the pass band may correspond to the transmitted light and the stop band may correspond to the reflected light. With reference to the laser cavity design depicted in FIG. 12, it may be convenient to integrate the band-pass filter 305 with a tilted element, e.g. the cavity length tuning element 1207 so that the light having frequency out of the pass-band of the band-pass filter 305 may be reflected away from the cavity, thus not providing unwanted feedback.

For a GMR tunable mirror, normal incidence may be required to have wavelength insensitive operation. Integration with the etalon may be not easy to realize because the etalon may have coatings with controlled reflectance values to provide the required filter Finesse. Integrating the band-pass filter 305 with a cavity length tuning element 1207, e.g. on one side or on both sides, has been demonstrated to be very useful to control the lasing mode frequency. In one example, the optical length may be tunable by the cavity length tuning element 1207 by means of a thermo-optical effect and its transmission spectrum response may be flat. In one example thin film coatings may be used to fabricate the pass-band filter on the tuning element. This may result in low additional cost and negligible cavity space occupation.

Figure 13:
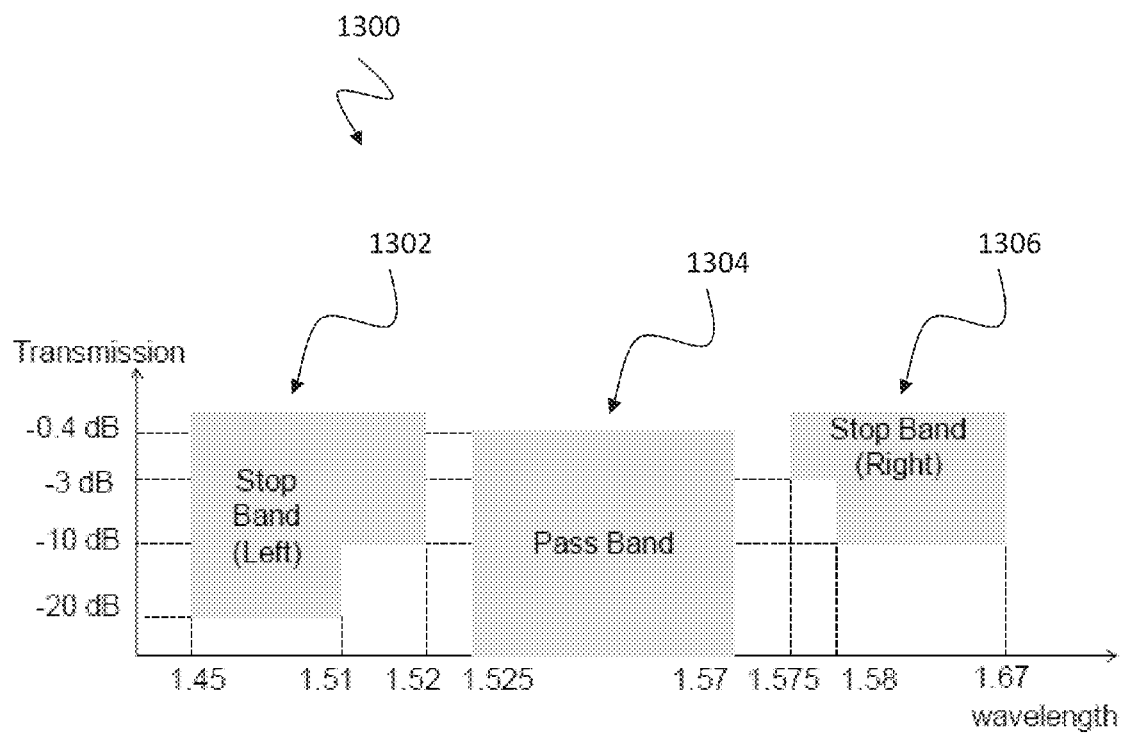
FIG. 13 shows a gain diagram illustrating one example of a band-pass filter design of an optical lasing device according to an implementation form.

FIG. 13 shows a gain diagram 1300 illustrating one example of a band-pass filter design of an optical lasing device according to an implementation form. The band-pass filter design may be centered on the C-band wavelengths range. The pass band 1304 lies between a left stop band 1302 and a right stop band 1306 as can be seen from FIG. 13.

In one example, the band-pass filter 305 may be implemented as a double-pass element. That means that the filtering function is squared. So to achieve the same specification in terms of out-of-band suppression, a more relaxed design of the filter can be made, involving a lower number of layers, if the Band-Pass filter 305 is made by means of a multi-layer stack.

Figure 14:
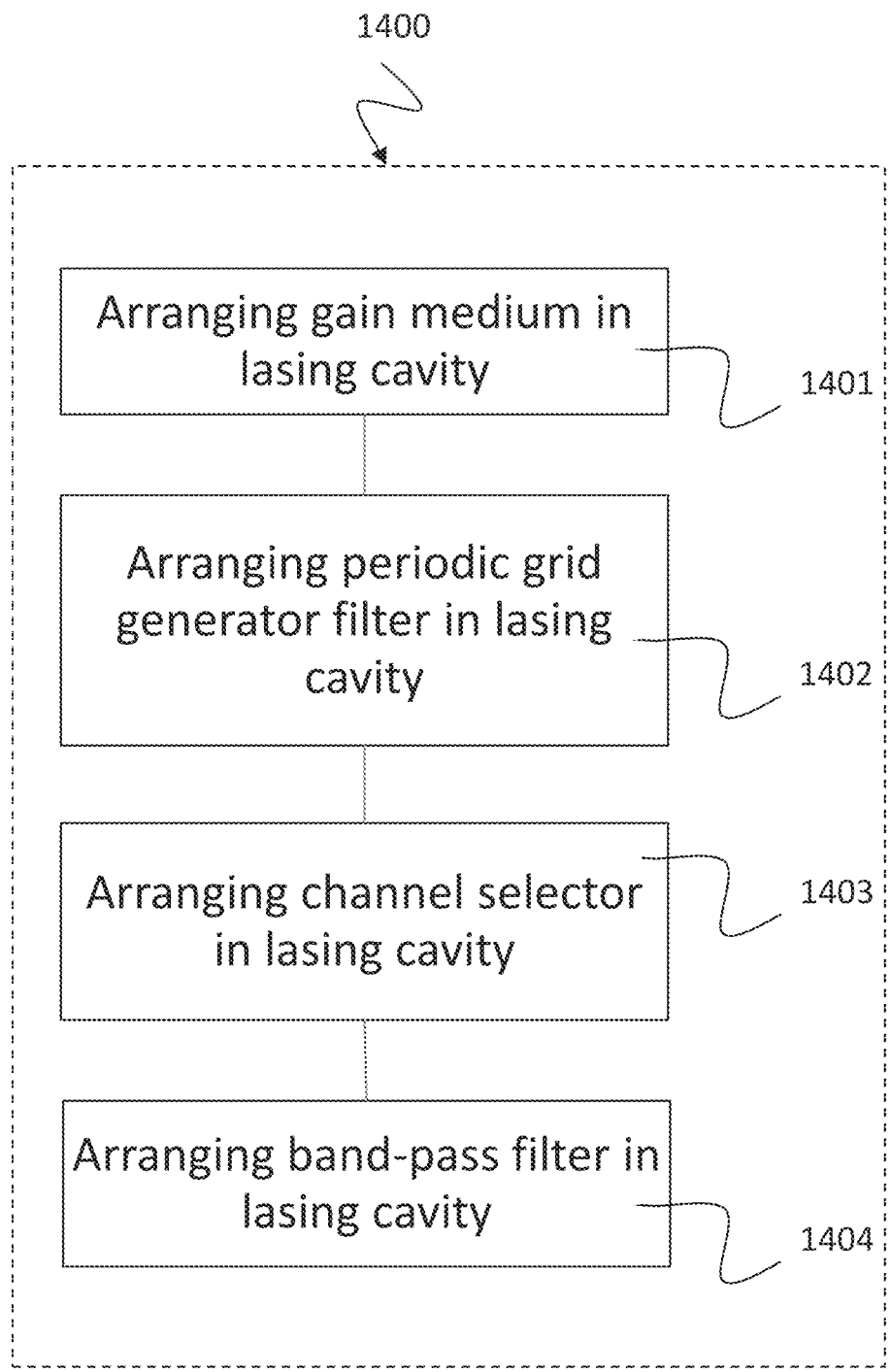
FIG. 14 shows a schematic diagram illustrating a method for generating a lasing mode in an optical lasing device according to an implementation form.

FIG. 14 shows a schematic diagram illustrating a method 1400 for generating a lasing mode in an optical lasing device according to an implementation form. The method 1400 may include arranging a gain medium in a lasing cavity 1401 having an optical axis, the gain medium providing light amplification. The method 1400 may include arranging a periodic grid generator filter in the lasing cavity 1402. The method 1400 may include arranging a channel selector in the lasing cavity 1403. The channel selector may be configured to select a lasing mode according to a frequency channel defined by the periodic grid generator filter according to an optimization criterion. The method 1400 may include arranging a band-pass filter in the lasing cavity 1404. The band-pass filter may be configured to suppress lasing modes which are outside of a pass-band of the band-pass filter.

The method 1400 may be used to operate an optical lasing device 300 as described above with respect to FIG. 3.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present inventions has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

The invention claimed is:

1. An optical lasing device comprising:
   a gain medium arranged in a lasing cavity having an optical axis, wherein the gain medium provides light amplification;
   a periodic grid generator filter arranged in the lasing cavity;
   a channel selector arranged in the lasing cavity and configured to select a lasing mode of the amplified light corresponding to a frequency channel defined by the periodic grid generator filter according to an optimization criterion; and
   a band-pass filter arranged in the lasing cavity and configured to suppress lasing modes which are outside of a pass-band of the band-pass filter,
   wherein the channel selsctor comprises a Guided Mode Resonance tunable mirror, and
   wherein the Guided Mode Resonance tunable mirror comprises at last one active layer having a tunable refractive index which is tunable between a first value and a second value higher than the first value.

2. The optical lasing device of claim 1, wherein the optimization criterion comprises tuning the channel selector within a frequency channel range such that a single lasing mode arises at a frequency corresponding to one channel of the periodic grid generator filter.

3. The optical lasing device of claim 1, wherein the pass-band of the band-pass filter is configured to coincide with a channels range according to a specification, wherein the specification comprises a C-band or L-band according to International Telecommunication Union (ITU) specification.

4. The optical lasing device of claim 1, wherein the second value of the tunable refractive index is such that at least two different waveguide modes are generated in the at least one active layer corresponding to at least two different reflection peaks.

5. The optical lasing device of claim 4, wherein the Guided Mode Resonance tunable mirror is configured to generate the at least two different reflection peaks within a spectral range of the gain medium.

6. The optical lasing device of claim 4, wherein the Guided Mode Resonance tunable minor is configured to:
   generate a main peak of the at least two reflection peaks at a specified channels range, wherein the specified channels range comprises a channels range specified by an international Telecommunication Union (ITU) C-band or L-band; and
   generate a secondary peak of the at least two different reflection peaks outside the specified channels range.

7. The optical lasing device of claim 6, wherein the Guided Mode Resonance tunable minor is configured to generate the secondary peak of the at least two different reflection peaks at an edge of the specified channels range.

8. The optical lasing device of claim 1, wherein the at least one active layer of the Guided Mode Resonance tunable mirror comprises a nematic liquid crystal layer.

9. The optical lasing device of claim 1, wherein the Guided Mode Resonance tunable mirror comprises at least one anti-reflection layer configured to operate only over the pass-band of the band-pass filter.

10. The optical lasing device of claim 1, wherein the band-pass filter is integrated with a cavity length tuning element in the lasing cavity.

11. The optical lasing device of claim 10, wherein the cavity length tuning element is tilted in the lasing cavity such that light having a frequency out of the pass-band is reflected away from the lasing cavity.

12. A method for generating a lasing mode in an optical lasing device, the method comprising:
   arranging a gain medium in a lasing cavity having an optical axis, wherein the gain medium provides light amplification;

arranging a periodic grid generator filter in the lasing cavity;

arranging a channel selector in the lasing cavity, wherein the channel selector is configured to select a lasing mode corresponding to a frequency channel defined by the periodic grid generator filter according to an optimization criterion;

arranging a band-pass filter in the lasing cavity, wherein the band-pass filter is configured to suppress lasing modes which are outside of a pass-band of the band-pass filter; and arranging in the channel selector a Guided Mode Resonance tunable mirror, wherein the Guided Mode Resonance tunable mirror comprises at least one active layer having a tunable refractive index which is tunable between a first value and a second value higher than the first value.

13. An optical lasing device comprising:
a gain medium arranged in a lasing cavity having an optical axis, wherein the gain medium provides light amplification;
a periodic grid generator filter arranged in the lasing cavity;
a channel selector arranged in the lasing cavity and configured to select a lasing mode of the amplified light corresponding to a frequency channel defined by the periodic grid generator filter according to an optimization criterion; and
a band-pass filter arranged in the lasing cavity and configured to suppress lasing modes which are outside of a pass-band of the band-pass filter,
wherein the channel selector comprises a Guided Mode Resonance tunable mirror, and
wherein the Guided Mode Resonance tunable mirror comprises at least one anti-reflection layer configured to operate only over the pass-band of the band-pass filter.

14. An optical lasing device comprising:
a gain medium arranged in a lasing cavity having an optical axis, wherein the gain medium provides light amplification;
a periodic grid generator filter arranged in the lasing cavity;
a channel selector arranged in the lasing cavity and configured to select a lasing mode of the amplified light corresponding to a frequency channel defined by the periodic grid generator filter according to an optimization criterion; and
a band-pass filter arranged in the lasing cavity and configured to suppress lasing modes which are outside of a pass-band of the band-pass filter,
wherein the bandpass filter is integrated with a cavity length tuning element in the lasing cavity.

15. The optical lasing device of claim 14, wherein the cavity length tuning element is tilted in the lasing cavity such that light having a frequency out of the pass-band is reflected away from the lasing cavity.

* * * * *